United States Patent [19]

Hall

[11] Patent Number: 5,009,485
[45] Date of Patent: Apr. 23, 1991

[54] MULTIPLE-NOTCH RUGATE FILTERS AND A CONTROLLED METHOD OF MANUFACTURE THEREOF

[75] Inventor: James T. Hall, Torrance, Calif.

[73] Assignee: Hughes Aircraft Company, Los Angeles, Calif.

[21] Appl. No.: 394,909

[22] Filed: Aug. 17, 1989

[51] Int. Cl.$^5$ .......................... G02B 27/00; B05D 5/12; C23C 14/54

[52] U.S. Cl. .................................... 350/163; 350/320; 427/8; 427/9; 427/10; 427/162; 427/163; 427/164; 427/165; 427/166; 427/167; 427/419.3; 427/419.4; 427/419.6; 427/255.2; 427/255.3

[58] Field of Search ................. 427/10, 8, 9, 162, 163, 427/164, 165, 166, 167, 419.3, 419.4, 419.6, 255.2, 255.3; 350/163, 320

[56] References Cited

U.S. PATENT DOCUMENTS

| | | | |
|---|---|---|---|
| 4,332,833 | 6/1982 | Aspnes et al. | 427/10 |
| 4,469,713 | 9/1984 | Schwiecker et al. | 427/10 |
| 4,545,646 | 10/1985 | Chern et al. | 350/162.2 |
| 4,582,431 | 4/1986 | Cole | 427/10 |
| 4,676,646 | 6/1987 | Strand et al. | 427/10 |
| 4,837,044 | 6/1989 | Murarka et al. | 427/10 |
| 4,915,476 | 4/1990 | Hall et al. | 350/163 |

*Primary Examiner*—Shrive Beck
*Assistant Examiner*—Margaret Bueker
*Attorney, Agent, or Firm*—M. E. Lachman; W. K. Denson-Low

[57] ABSTRACT

An error-compensated process for forming a multiple-notch optical filter which is characterized by a continually and accurately varying periodic profile. The optical medium if formed on a substrate so that the profile of the refractive index is multiply sinusoidally modulated to maintain Bragg's law for each component in the multiple-notch profile. In a preferred embodiment, as the optical medium is coated on the substrate, the depositing film is monitored by optical techniques, and feedback information is provided to a computer driven by a pre-programmed process control algorithm so that real time control of the manufacturing process may be accomplished.

9 Claims, 7 Drawing Sheets

MULTIPLE-NOTCH RUGATE FILTERS AND A CONTROLLED METHOD OF MANUFACTURE THEREOF

BACKGROUND OF THE INVENTION

1. Field of the Invention

This invention relates generally to the field of optically reflective filters and materials, and, more particularly, to a multiple-notch rugate filter manufactured under a monitored and feedback-controlled deposition process.

2. Description of Related Art

An important criterion in the operation of optical sensors is protecting the sensors from possible damage caused by lasers. This protection is referred to as laser hardening and has become necessary due to the widespread use of lasers in industrial and military applications, such as ranging and communications.

Such protection is needed because laser radiation from friendly or hostile sources, even at lower energy levels, can disable or damage a detection system by saturating or burning out vulnerable components or detector elements. While protecting such systems, low spectral distortion and high see-through are needed to depict an accurate signal.

In conventional laser-hardening schemes, a standard method of such protection is a multilayer dielectric reflective filter made of alternating layers of dissimilar materials. Among the problems associated with the use of such a discrete multilayer structure is a residual stress in each layer caused by incompatible material properties at the abrupt interfaces. This stress, a problem common to discrete multilayer coatings, can weaken the structure and lead to delamination of the layers. In addition, abrupt interfaces between dissimilar materials can be sites for dislocation and a high concentration of impurities. These sites can lower the protection capability and power tolerance of the filter if radiation is scattered into the detector or absorbed in the filter. Multilayer filters also have inadequate broadband signal transmittance due to the undesired sideband reflectance peaks that arise from the interference effects inherent to the filter design limitations of alternating layer structures.

Simple reflective multilayer dielectric filters typically consist of alternating layers of two dielectric materials of different refractive indices, which are formed on the surface of a substrate by known deposition techniques, such as chemical vapor deposition, sputtering, or thermal evaporation. The optical thickness (in this case, the product of the refractive index and layer thickness) of each layer is chosen to be one quarter of a wavelength of the radiation to be reflected, and such a structure is therefore referred to as a "quarter-wave stack". As previously noted, such multiple-layer filters exhibit numerous problems, including the production, upon intense irradiation, of highly localized fields occurring at the abrupt interfaces between the layer surfaces, which can produce temperature increases, which in turn can lead to structural failure due to interfacial stresses.

In order to improve upon optical materials for use in optical filters, U.S. Pat. No. 4,545,646 to Chern et al. (issued Oct. 8, 1985 and assigned to the present assignee) provided a graded-index optical material having continuous gradations in the stoichiometric composition and refractive index as a function of thickness of the material. The structure disclosed in U.S. Pat. No. 4,545,646 to Chern et al. addressed many of the drawbacks, such as design and performance limitations, in multilayer filters. Chern et al. discloses a method whereby the substrate is exposed to first and second vapor phase reactants in predetermined proportions in the presence of radiation to induce a chemical reaction whereby the desired optical material is formed and deposited on the substrate. The optical material is deposited in accordance with a predetermined index of refraction. The proportion of the reactants to which the substrate is exposed is altered as a function of time in a predetermined and continuous manner which allows the predetermined and continuous variation of the stoichiometric composition and the index of refraction of the deposited material to produce a graded index of refraction which reflects radiation at a given wavelength. In this single-notch process of Chern et al. it is assumed that the deposition process will occur according to the predetermined pattern. However, no method for insuring the accuracy of the deposition pattern was provided by Chern et al.

In order to provide protection against multiple laser lines, multiple single-notch rugate layers could be stacked one on the other. Each stack, however, requires a separate process segment with possible interfacial problems between stacks. Superposition of component sinusoidal modulations allows a single process segment for simultaneous multiple notch formations. Chern et al. also disclosed the formation of a multiple-notch rugate filter from a graded index coating having a composite index profile that is based on the linear superpositioning of a number of sinusoidal index profiles. For example, three separate index profiles can be combined to form a composite refractive index profile which provides protection against three separate wavelengths. The ability to control and insure the accuracy of the deposition pattern is especially crucial in preparing multiple-notch filters. However, rugate filter fabrication can tolerate errors no greater than about one percent to the original design guide, as disclosed by Southwell et al. in U.S. Pat. No. 4,707,611. Therefore, errors greater than one percent need to be compensated as they occur, or else the fabrication process requires termination and starting over.

Thus, a need exists in the field of optical filters for a method of forming multiple-notch rugate filters from graded index optical materials in a controllable and accurate manner.

SUMMARY OF THE INVENTION

The present invention provides an error-compensation method for insuring attainment of a thin-film multiple-notch optical filter deposited on a uniform substrate and having desired properties. The thin-film, optically interactive medium has an algorithm-controlled, error-compensated, nearly continuously varying refractive index profile perpendicular to the plane of the substrate. The varying refractive index profile of the medium is predominantly reflective at multiple-notches or multiple bands of wavelength. The refractive index profile necessary to provide the multiple-notch filter is a combination or superpositioning of sinusoidally varying refractive index profiles, each of which alone provides reflection at a single wavelength or notch. In one embodiment of the present invention, the optically interactive medium may comprise a photochemically deposited film of silicon oxides ($SiO_x$).

The optical filter medium of this invention is characterized by a continuously varying refractive index profile that is error-compensated according to an algorithmic method of optical coating monitoring, wherein the medium is multiple-sinusoidally phase adjusted during deposition to follow a predetermined and optically measurable pattern. For this purpose, the use of the algorithm is novel, and the optical monitoring can be performed with standard, conventional means. The optically interactive medium coated upon a uniform substrate, that together with the substrate comprises the multiple-notch rugate filter of this invention, is transmissive to optical radiation except near or at particular notches of wavelength wherein the filter is predominantly reflective, and is referred to herein as "a multiple-notch rugate filter". A salient aspect of this multiple-notch rugate filter method is to form this optical medium layer so that the product of the average index of refraction and the component sinusoidal period thicknesses are maintained in such a manner that the desired Bragg reflective condition for each notch is achieved accurately. This result is achieved through compensation of errors based on algorithmic actions according to optical monitoring signals during filter deposition. The algorithm directs the deposition process to make minor adjustments, either vertically or horizontally, to the depositing index profile in such a manner that the multiple-notch rugate profile that is theoretically desirable is accurately followed in an error-compensated manner. The resulting deposited index profile therefore results in practicably realizable multiple-notch rugate filter properties. The present algorithmic method of deposition which forms a multiple-notch filter medium that is coated onto a uniform substrate includes the steps of:

(a) providing said substrate;
(b) providing reactants which interact physically or chemically to form said optical material as a layer on said substrate;
(c) providing an ideal target profile of refractive index versus thickness of said layer, said profile having a multiple-notch composite pattern formed from superpositioned single-notch sinusoidal patterns, and determining from said target profile ideal values of optical thickness at successive points in time corresponding to points along said profile;
(d) providing target process conditions as a function of time for said reactants operative to form said layer having said ideal target profile;
(e) initiating said process conditions to form a layer having a depositing profile;
(f) performing continuous optical monitoring of said layer as deposited to provide a control signal;
(g) determining from said control signal the measured increments of optical thickness of said layer as deposited, and continuously monitoring said increments of optical thickness;
(h) determining whether said optical thickness value is measured at the predetermined time relative to said target process conditions that produce said ideal target profile;
(i) based on the results of (h), determining the multiple sinusoidal phase-angle adjustments required to be made to the depositing profile of refractive index versus thickness of said layer in order to follow accurately said ideal target profile;
(j) altering said process conditions over time to provide said adjustments to said actual profile;
(k) repeating steps "f" through "j" the number of times required to form said multiple-notch rugate filter.

As the multiple-notch filter medium is being deposited to create the rugate filter, an optical monitoring light beam is directed at the medium so that the light beam is reflected off or transmitted through the medium at a perpendicular or known angle of incidence to an optical thickness detector system, which can be a conventional design similar to that used in monitoring and controlling quarter-wave stack depositions. This detector system generates output signals which are a function of the light beam intensity directed into the detector. The output signals are then fed back to the computerized deposition controller in order to adjust the commands of the deposition. In particular, to compensate for any systematic and random errors which may have occurred in the actual (depositing) profile, the target refractive index profile (with respect to growth thickness) is commanded to be adjusted with minor corrective structures that are either horizontal or vertical with respect to whether a target optical thickness is expectedly overdue or prematurely measured. The multiple-notch filter medium produced according to the error compensation method of this invention results in a multiple-sinusoidally modulated refractive index profile such that the desired filter is accurately achieved since the notch wavelengths are individually (as Fourier components) the product of two times each sinusoidal period thickness and the average refractive index, according to Bragg's law. The relative accuracy of the optical thickness detector system insures the accuracy of the desired multiple Bragg-reflective structures if corrective actions are made often enough (typically four times for the shortest sinusoidal period to compensate for the most severe errors).

BRIEF DESCRIPTION OF THE DRAWINGS

FIG. 2b shows a graphic representation of reflectance versus wavelength of the refractive index profiles given in FIG. 2a.

(FIG. 3a shows approximately ⅓ of error-controlled profile of FIG. 3b.)

DETAILED DESCRIPTION OF THE PREFERRED EMBODIMENT

Figure 1:
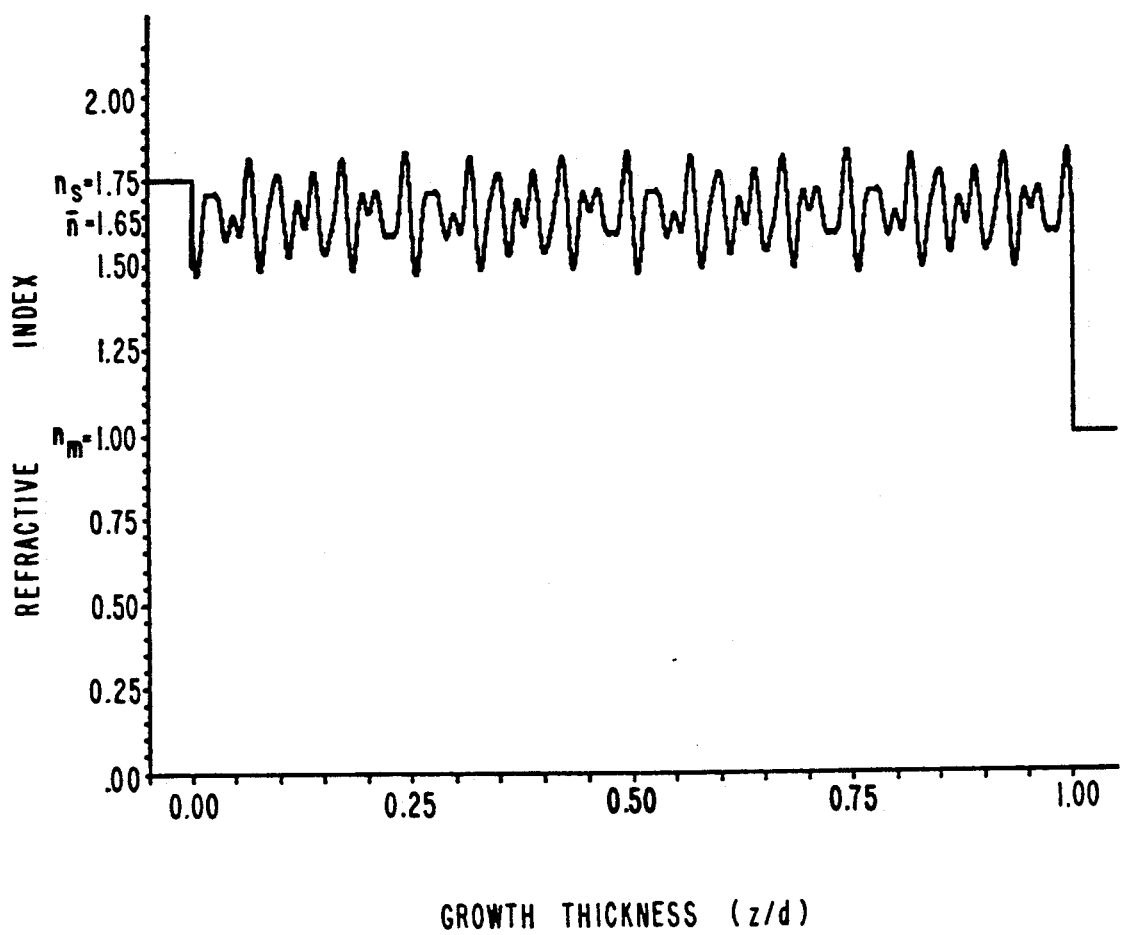
FIG. 1 shows an ideal schematic triple-notch, sinusoidal rugate profile versus film growth of the optically active medium coated on a substrate as a simple illustrative example of a multiple-notch filter structure.

FIG. 1 shows a schematic view of an ideal, triple-notch rugate filter profile taken along the film thickness direction z. The final ideal thickness is d, $n_m$ is the surrounding medium index (air), $n_s$ is the substrate index, and $\bar{n}$ is the average ideal index. As an example of a multiple notch rugate filter, a triple-notch will be used for purposes of illustration. It is not, however, intended to limit the present invention to a triple-notch filter, but rather to include any number of notches as may be required. The term "notch" is used in its accepted meaning to indicate a nearly zero transmittance band. This ideal profile is formed by the superposition of three sinusoidal modulation components, one for each notch according to the following equation.

$$n(z) = \bar{n} - \tfrac{1}{2} \sum_{i=1}^{3} \Delta n_i \sin\left(\frac{4\pi \bar{n} z}{\lambda_i}\right) \qquad \text{Equation (1)}$$

where pi $\lambda_i$ = each transmittance notch wavelength;
$\bar{n}$ = the average index of refraction over one period in film thickness space;
$\Delta n_i$ = the amplitude modulation of the sinusoidal component.

Each sinusoidal component of the index profile in film thickness space (along the z axis) is a spectrally pure form of periodic structure that will produce a predominant Bragg reflection at a respective, narrow wavelength band. As used herein, the term "Bragg Reflection" refers to the fact that a periodic structure of the rugate filter follows Bragg's Law, originally applied to x-ray diffraction, which predicts that there will be a reflectance maximum in wavelength at the "notch wavelength," which is defined as follows:

$$\lambda_i = 2\bar{n} L_i \cos\theta \qquad \text{Equation (2)}$$

where
$L_i$ equals each of the physical lengths of periodicity or the $i^{th}$ periodicity cycle in film thickness space along the z axis; and
$\theta$ equals the angle of incidence of radiation, as measured from the perpendicular to the surface.

A discussion of Bragg's Law may be found, for example, in the book by D. Halliday and R. Resnick, entitled "Physics," Parts I and II, 1966, at page 1140 et seq. and in the publication by P. Yeh, A. Yariv, and C.-S. Hong, J. Opt. Soc. Am., Vol. 67, 1977, at page 423 et seq., both of which are incorporated herein by reference.

Unlike a quarter-wave stack which may be made from many layers of two alternating homogeneous films of high and low index, the rugate filter of this invention is continuously varying and can be deposited on the substrate using continuously varying process conditions, thus varying the composition of the filter medium material in a continuous manner and continuously varying the refractive index locally, at the surface of deposition, as it is produced. Instead of a stack of two alternating homogenous films, as in known structures, a proper blend of two optical materials during filter deposition can produce a rugate index profile, which comprises a "multiple-notch rugate filter". The process conditions for the proper blend can be predetermined through prior calibration experiments that characterize deposition rates and mixing of constituent optical materials for the composite refractive index value desired.

Photochemical vapor deposition (photo-CVD) is used to produce an optical coating having a continuously varying refractive index profile in the form of $SiO_x$, that is, silicon oxide with varying x fraction ($1 \leq x \leq 2$) from silane ($SiH_4$) and nitrous oxide ($N_2O$) as described for example in U.S. Pat. No. 4,545,646 to Chern et al., which is assigned to the present assignee. The Chern et al. patent is incorporated herein by reference. The oxygen fraction of the layer is modulated (silicon monoxide and silicon dioxide materials are counterblended) to produce a refractive index profile of a rugate filter which can be generated with refractive index control between about 1.46 and 2.0 since the refractive index varies with the fraction y where $0 < y < 1$ as:

$$n(y) \approx 1.46 + 0.54y, \qquad \text{Equation (3)}$$
for $(SiO)_y(SiO_2)_{1-y}$
near $\lambda$ in the visible Further details of this embodiment of the present invention are provided below in the discussion of FIG. 5. However, the present invention is not limited to photochemical vapor deposition, but rather can be applied to any method for forming an optical material in which two or more reactants interact physically or chemically to deposit a layer of the optical material. Such other methods include, but are not limited to, thermal chemical vapor deposition including metal-organic chemical vapor deposition, thermal evaporation or physical vapor deposition, electron beam evaporation, sputter deposition, and molecular beam epitaxial growth.

Figure 2A:
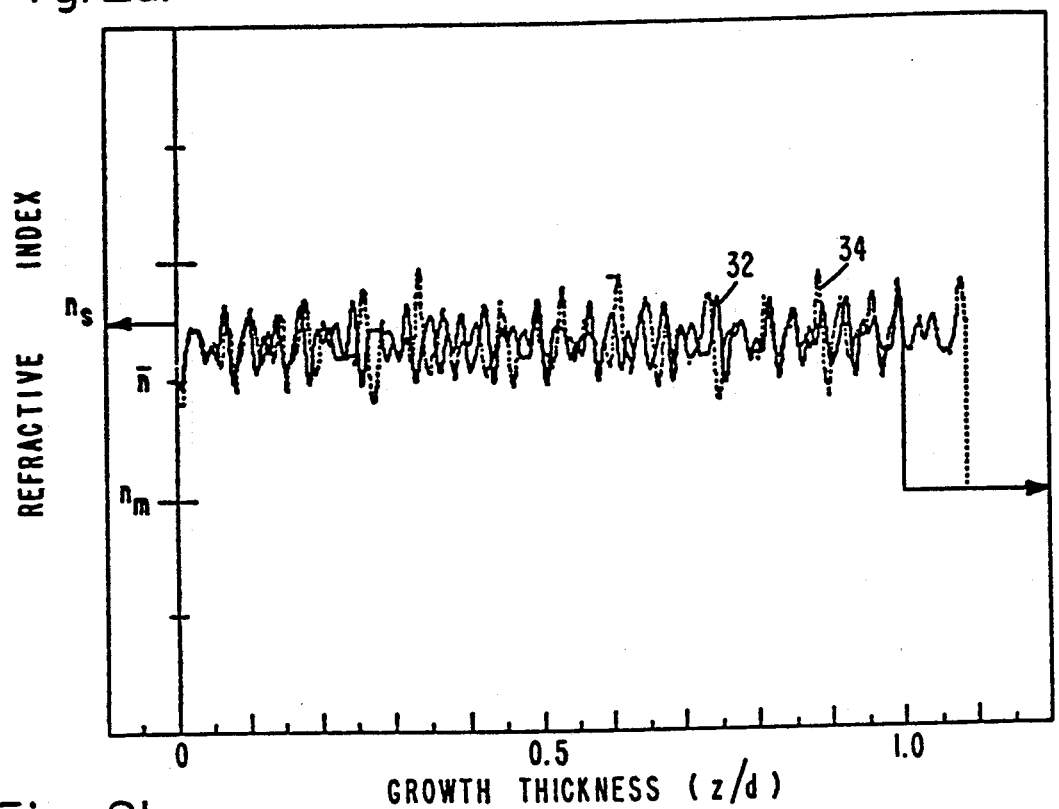
FIG. 2a shows a graphic representation of the refractive index profile versus growth thickness for a triple-notch filter and compares a simulated index profile subjected to random and systematic process errors relative to an ideal, error-free profile.
Figure 2B:
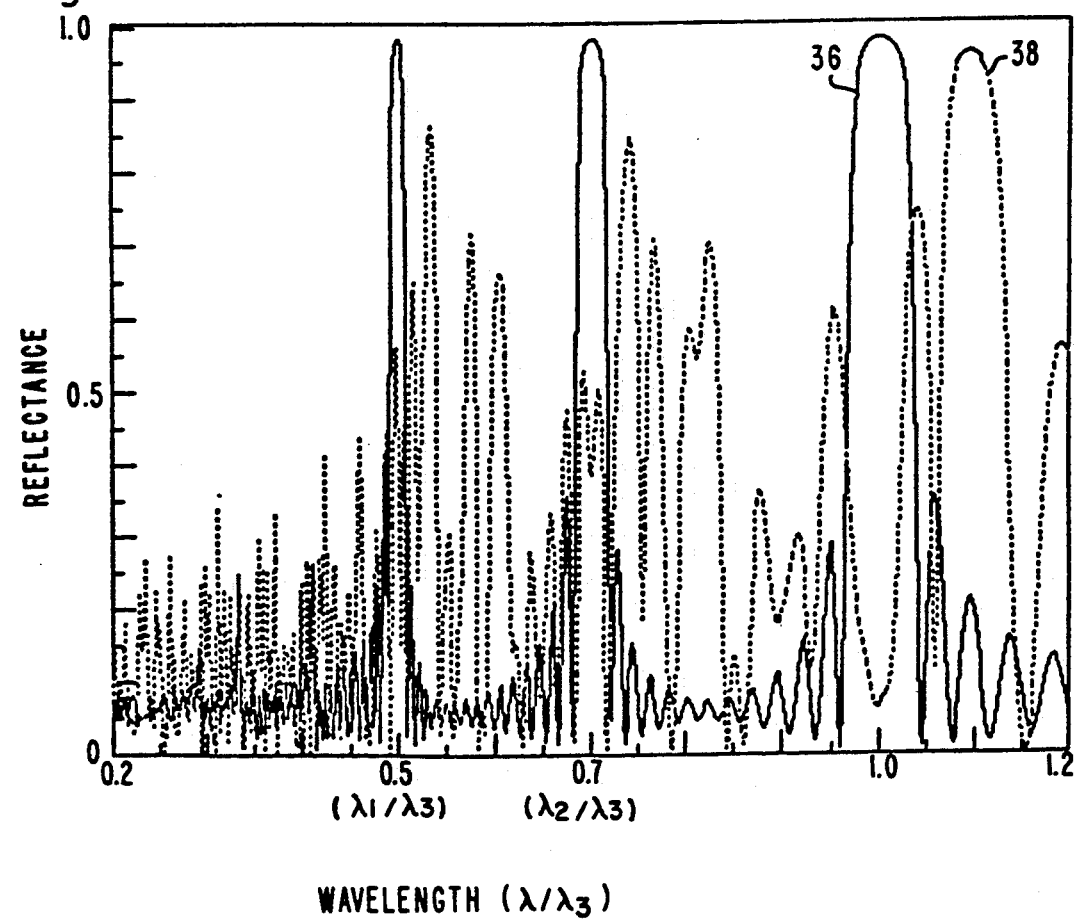

FIG. 2a (solid line) 32 shows an ideal triple-notch rugate-filter index profile versus growth thickness relative to an "error profile" simulated to have random and systematic errors along the profile (dotted line) 34. A fixed, time independent systematic error is responsible for this profile (i.e., error profile) ending up too thick, and random errors are responsible for small localized deviations. FIG. 2b shows the ideal error-free (solid line) 36 and error-containing (dotted line) 38 reflectance-versus-wavelength spectra (scaled to the notch wavelength $\lambda_3$) of the index profiles of FIG. 2a. Note that the notch region is greatly distorted in the spectrum of the error profile and that these errors are uncompensated by the algorithm of the present invention.

For illustrative purposes, although somewhat exaggerated for typical blind process control results, the error profile 34 of FIG. 2a contains random errors that can statistically occur 30 times per period or about 1680 times for the whole profile. These random errors can be characterized by about a 10% standard deviation in the optical thickness of each of the 1680 deposition increments. In addition, there is an arbitrarily chosen, fixed systematic error that forces the deposition rate to be 10% too fast. This systematic error in turn causes the optical thickness (i.e. the integral of the index profile over the film thickness space) of the whole profile to finish about 10% too large.

Such an ideal rugate filter profile as shown in FIG. 2a at 32 may be achieved (if no errors occur) by properly varying deposition parameters. In the case of the photo-CVD process, the primary parameter is the concentrations of the precursor silane ($SiH_4$) in a background of nitrous oxide ($N_2O$), as described in Chern et al., previously referenced. Thus, by using predetermined calibrations, it is possible to control the refractive index profile of the rugate filter by varying the deposition parameters as a function of time to produce a multiple-notch rugate filter having an index profile in accordance with the present invention.

In accordance with the present invention, there is provided a multiple-notch rugate deposition method (if errors do occur) which is controlled by an algorithm such that a rugate filter medium may be coated on the substrate according to the dictates of a predetermined error-correction mechanism which, in turn, relies on the relationships in Bragg's Law and optical-thickness signal monitoring. This method thus achieves index components with periodically accurate, sinusoidal index modulations that are sufficient to produce the desired multiple-notch rugate filter properties.

Figure 3A:
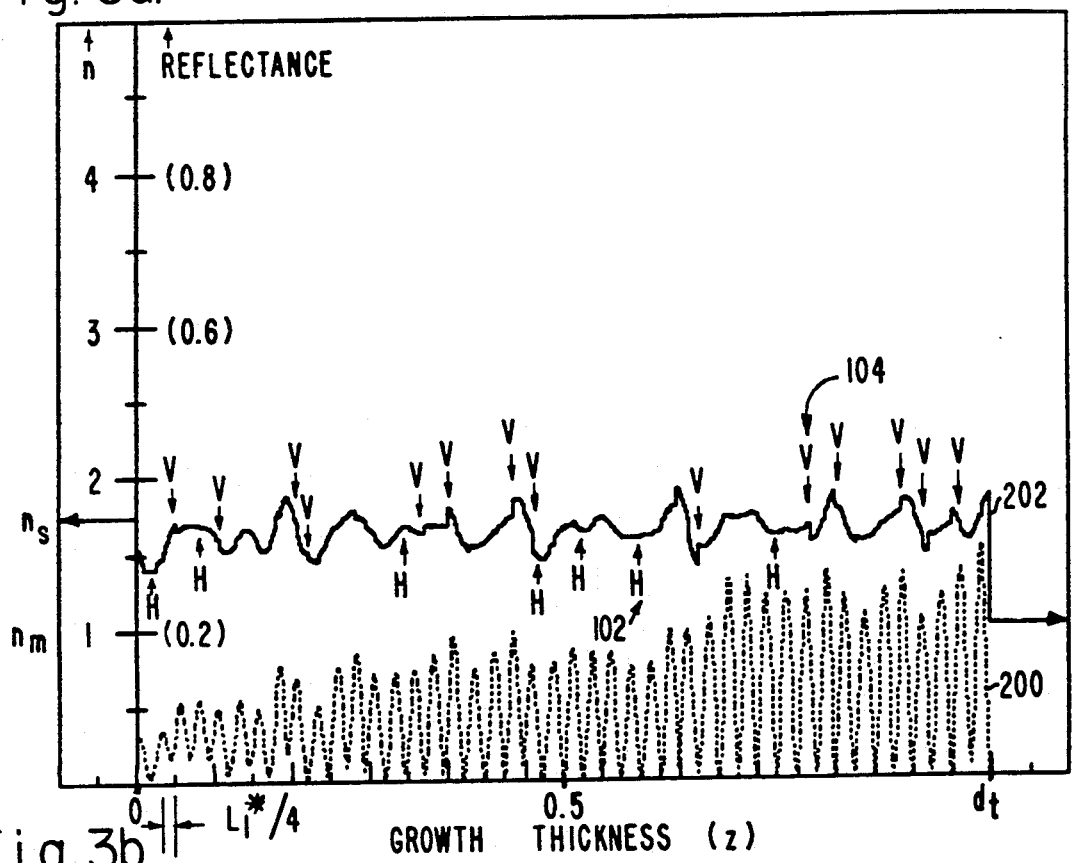
FIG. 3a shows a schematic graphic representation of the effects of monitoring at one-half of the lowest notch wavelength, the resulting optical thickness signals, and the related algorithmic actions, according to the present invention, on refractive index profiles (as a function of film thickness position) subjected to illustrative fixed systematic deposition rate errors.
Figure 3B:
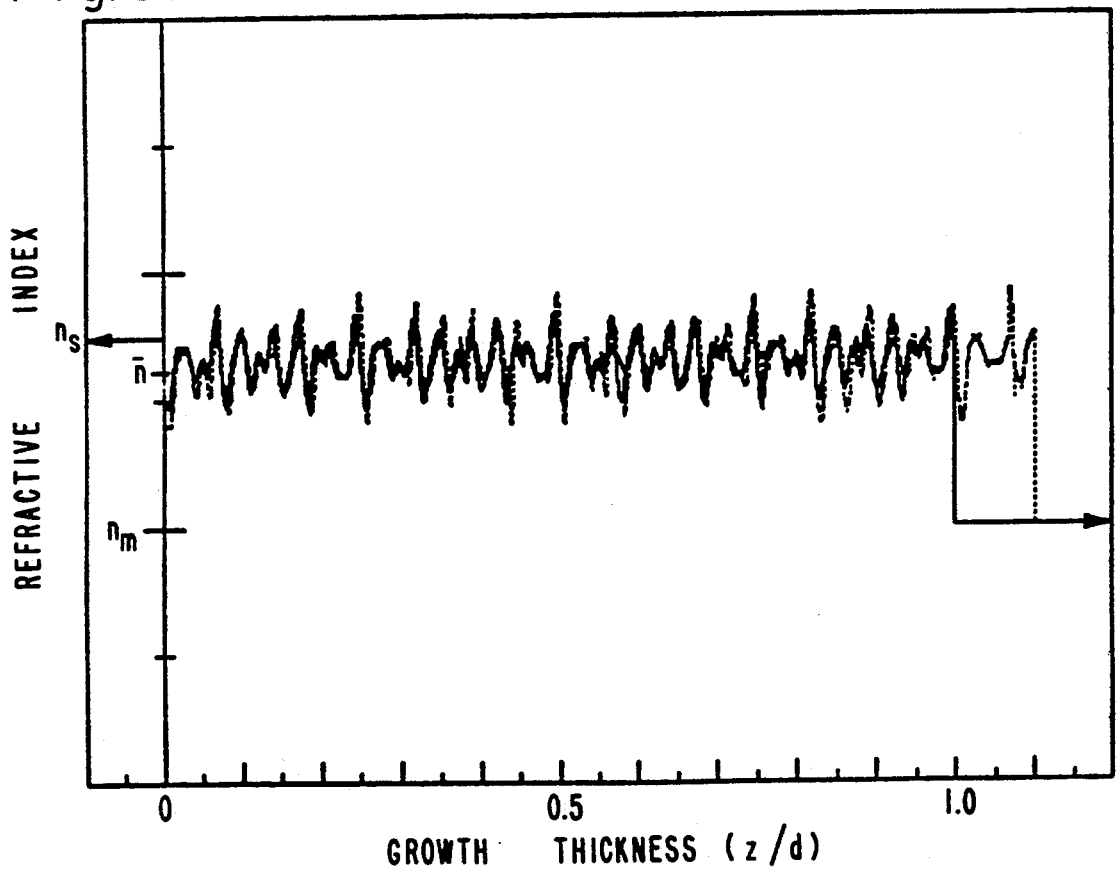
FIG. 3b shows a graphic representation of the effects of optical monitoring and algorithmic error compensations according to the present invention on the index profile subjected to the same process errors as in FIG. 2a, relative to an ideal, error-free profile.
Figure 3C:
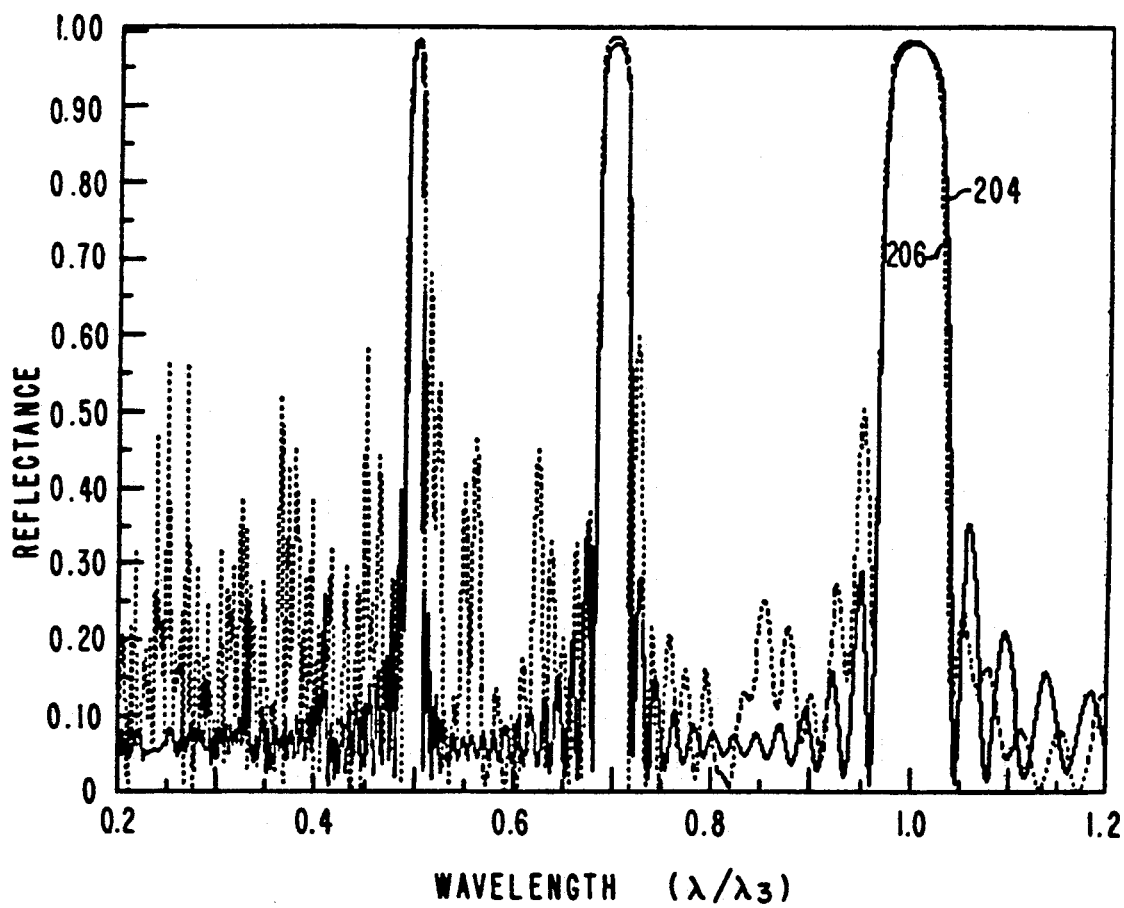
FIG. 3c shows a graphic representation of reflectance versus wavelength of the final refractive index profile given in FIG. 3a, relative to an ideal, error-free spectrum.

A rugate profile is designed according to the present method with a predetermined error-correction mechanism which includes optically monitoring the medium as it is being deposited on the substrate. As an example of the algorithm process, as shown in FIG. 3a, an optical monitoring signal (in this case a single-wavelength reflectance at normal incidence with a monitor wavelength at one-half of the lowest notch wavelength $\lambda_1$), dotted line 200, has been juxtaposed to the refractive index profile (solid line 202) subjected to the same errors as in FIG. 2a, but now compensated through corrective actions provided by the algorithm of this invention. Both vertical (V at 104) and horizontal (H at 102) index profile corrections are indicated in FIG. 3a and are discussed in further detail below. In FIG. 3a, n is index profile, z is film growth thickness, $d_t$ is film temporary thickness, and reflectance is the optical monitor reflectance. The optical monitoring film thickness increment is $L_1^*/4$ where $L_1^*$ is the smallest periodicity, subject to local errors. FIG. 3a shows only the beginning third of the film in order to magnify actions of the algorithm. Random and systematic errors have been taken into account by the algorithm (shown in detail in FIGS. 4a and 4b) which is useful in establishing a highly accurate profile as shown in FIG. 3b and a finely tuned multiple-notch rugate filter, as shown by the reflectance spectrum in FIG. 3c. In FIG. 3b, the ideal profile is indicated by the solid line (which is the same as line 32 in FIG. 2a), and the error-compensated profile is indicated by the dotted line. FIG. 3c shows the ideal (solid line) 204 and error-compensated (dotted line) 206 reflectance-versus-wavelength spectra. Note the improvement of the error-compensated spectrum 206 of FIG. 3c over the error spectrum 38 of FIG. 2b with the use of the algorithm of the present invention. It should be noted that in FIG. 3a there are more vertical corrections than horizontal corrections since, in this case, the systematic error caused the deposition rate to be too fast.

The rugate filter is deposited on a uniform substrate according to an algorithm which represents the following considerations in order that the deposition be undertaken in a reliable and controlled fashion. As the deposition occurs in real time, the medium is continuously optically monitored to assure that the multiple sinusoidally developing medium profile has measured optical thickness increments that match accurately enough the ideal target optical thickness increments; adjustments are made to the on-going process according to pre-programmed alternative sequences (the algorithm) where the optical thickness signals accurately guide a sinusoidal deposition of the optical medium. If (1) an optical thickness signal has been actually measured, then the deposition conditions jump and continue according to where the process conditions should be for this signal rather than where any error may have taken them, or if (2) an optical thickness signal is overdue relative to the current process conditions, then the process conditions hold in anticipation of the target optical thickness signal. (If no error is present, the deposition process conditions continue according to where they should be.) Consequentially, the subject invention provides for both horizontal and vertical index profile corrective actions. (The terms "horizontal" and "vertical" refer to two perpendicular directions in the index versus thickness plane, as shown in FIG. 3a and designated by "H" and "V", respectively.) Accurate, incremental optical thickness signals can be easily measured by standard and conventional means since interference minima and maxima occur at every quarter-wave increment of optical thickness relative to a reflected or transmitted monitoring wavelength, as depicted in FIG. 3a (dotted line 200) for reflectance. Monitoring for the maxima and minima are referred to in the art as the "turning value method."

Figure 4A:
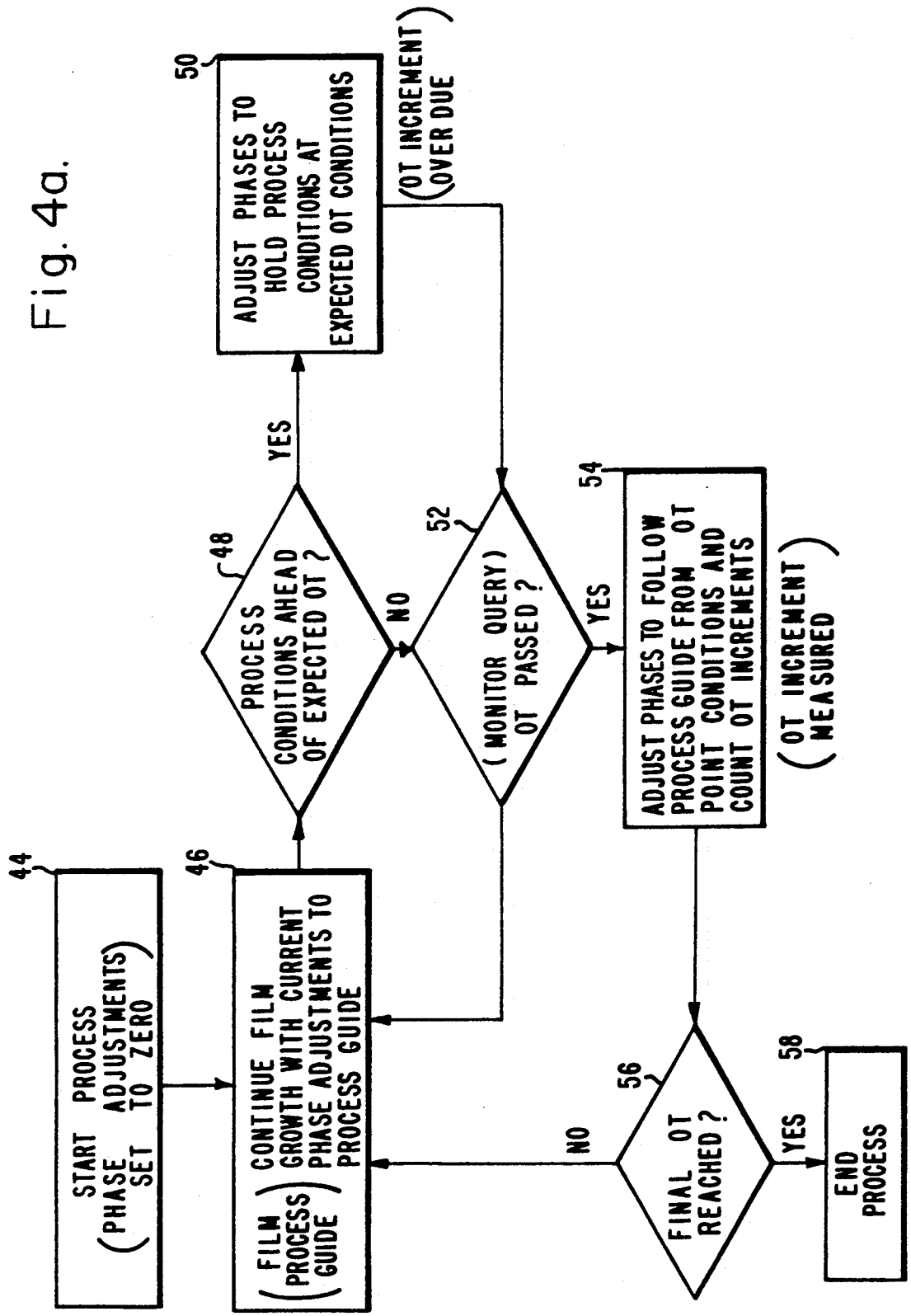
FIG. 4a is a flow diagram of the multiple-sinusoidal phase-control algorithm of the present invention.

FIG. 4a shows a flow diagram of the process phase-control algorithm of the present invention. An ideal profile of refractive index versus layer thickness is predetermined as a target profile. This ideal profile has a multiple-sinusoidal pattern for multiple-notch filters. The profile also has predetermined values of optical thickness which can be determined for successive points in time corresponding to points on the ideal target profile. Based on known process parameters, target process conditions as a function of time are predetermined which will be effective for forming a layer of optical material guided by the ideal target profile. These process conditions are determined by a series of calibration trials in which variables affecting the chosen process are changed, and the effect on the deposited layer determined. Such variables for a chemical deposition process include, but are not limited to, ratios of reactants, concentrations of reactants, flow rate of each reactant, total gas flow rate, pressure, temperature of reactants, temperature of substrate, and rate of deposition. (The term "reactant" as used herein is intended to include materials which interact physically, as well as materials which interact chemically.) Additional relevant variables for a photochemical process may include the intensity of radiation and distance between the radiation source and the substrate. The process commands for the ideal target profile are then shifted, if necessary for error compensation, during deposition with continual and/or continuous multiple sinusoidal phase adjustments (controlled by the algorithm) relative to the current process conditions and the optical thickness (OT) status.

While not limiting the present invention to a particular theory of operation, the theory supporting the present process is believed to be as follows. The profile guided by the algorithm can be represented as:

$$n(z;\phi_i) = \overline{n}^* - \frac{1}{2} \sum_{i=1}^{m} \Delta n_i^* \sin\left(\frac{4\pi \overline{n}^* z^*}{\lambda_i} + \phi_i\right) \quad \text{Equation (4)}$$

where
- $\underline{n}$ = refractive index of optical material
- $\overline{n}$ = average index of refraction over one period in film thickness space (z)
- m = total number of rugate transmittance notches
- z = design position of layer or film
- i = component integer
- $\Delta n_i$ = $i^{th}$ peak-to-trough index modulation
- $\lambda_i$ = $i^{th}$ notch wavelength
- * = parameters that can have (unknown) localized random and/or systematic errors, which are compensated for by $\phi_i$ $\phi_i$ = $i^{th}$ sinusoidal phase adjustment, continually updated through algorithm (FIGS. 4a and 4b) to insure Bragg reflection at $\lambda_i$ $= \frac{\pi}{\lambda_i}(\lambda_p q - 4nz')$ where $\lambda_p$ = probe monitoring wavelength $q$ = $q^{th}$ OT (integer: 1,2,3, ...)

$z' = \begin{cases} z \text{ when } q^{th} \text{ OT signal overdue} \\ z_q \text{ (value of z) when } q^{th} \text{ OT signal received} \end{cases}$ Each term $\phi_i$ is one component of the multiple-sinusoidal phase-angle adjustment. The term "multiple-sinusoidal phase-angle adjustments" is used herein to mean the multiple $\phi_i$'s required to be commanded simultaneously at each algorithmic decision point to the depositing profile in order to follow accurately the ideal target profile.

In general, the refractive index can be related to a one-parameter function (e.g., stoichiometric material fraction "y") of the material system, and this one parameter can be controlled as a function of time. Usually, the index is monotonically behaved over a useful range, which means that the inverse relation is also a function or that the system parameter is a function of the index. Therefore, given an index design (e.g., n(z) of Equation 1 where the index profile can be described as a sum of sinusoids), and knowing the precalibrated deposition rate, the generic process conditions can be considered to be universally controllable as a function of time (e.g., each sinusoid can have a phase correction $\phi_i$ in $n(z;\phi_i)$ of Equation 4 and the target z can be a function of time). Analytically, this means that given a generic process $\Psi$ that has process control conditions $\Psi = \Psi(P_1, P_2, P_3, ...P_j,...P_s)$  Equation (5)

where $P_j$ is the $j^{th}$ parameter in process conditions with a total of s pertinent parameters, for achieving a useful material mixture, $U_y V_{1-y}$ ($0 \leq y \leq 1$) of two components, U and V where the mixture has a refractive index, $n = n(y)$  Equation (6)

then the mixture is a function of the calibrated process parameters, $y = y(P_1, P_2, P_3, ...P_j,...P_s)$  Equation (7)

If y monotonically varies over a useful range of each $P_j$ and n(y) varies over this range of y, then the process conditions can be controlled as a function of time, t, and sinusoidal phases, $\phi_i$ $\Psi = \Psi(t;\phi_i) = \Psi[P_1(t;\phi_i), P_2(t;\phi_i), ...$
$...P_j(t;\phi_i),...P_s(t;\phi_i)]$  Equation (8)

in order to control the refractive index profile. This follows because $P_j = P_j(y)$, (monotonic in y, $y_{min} \leq y \leq y_{max}$) Equation (9)

$y = y(n)$, (monotonic in n, $n_{min} \leq n \leq n_{max}$)  Equation (10)

$n = n(z;\phi_i)$, (profile design from Equation 4 above)

$z = z(t)$, (target thickness as function of time)  Equation (11)

Hence, $P_j = P_j(y\{n[z(t);\phi_i]\}) = P_j(t;\phi_i)$  Equation (12)

and therefore $\Psi = \Psi(t;\phi_i)$ is true above in Equation 8, and the process can be controlled as a function of time.

Note that z = z(t) depends on a previously calibrated deposition rate or a deposition rate behavior as a function of time, but if the actual thickness can be determined by an independent thickness monitor (e.g., a calibrated quartz-crystal monitor), then the variable can more usefully be this independently measured thickness, z.

The only restriction on the $\Delta n_i$ is placed by the maximum amplitude of index modulation, $\Delta n_{max}$, available to the process, or $\Delta n_{max} = \sum_{i=1}^{m} \Delta n_i$  Equation (13)

Therefore, if generic process conditions exist for "blind" process control of a desired index profile design subject to process errors, then the phase-control algorithm of the present invention can be applied to enhance and sufficiently control such a process by commanding compensation for such errors.

As an example, consider the deposition of a multiple notch rugate filter by the photochemical vapor deposition of $(SiO)_y (SiO_2)_{1-y}$ where ($0 \leq y \leq 1$)
Material System: U = SiO, V = $SiO_2$
For all practical purposes Equation 6 above is known (near $\lambda \approx 0.6$ $\mu$m) to be $n = n(y) = 1.46 + 0.54y$, ($0 \leq y \leq 1$)  Equation (6A)

Monotonic behavior implies that Equation 10 is $y = y(n) = \frac{n - 1.46}{0.54}$  Equation (10A)

By properly varying the process precursors, such as silane ($SiH_4$) and nitrous oxide ($N_2O$), it is possible to control the fraction, y. For example, by only varying the $SiH_4$ flow, $F_S$, while keeping constant the other photo-CVD process conditions (such as chamber pressure [1 to 2 Torr], substrate temperature [50 to 200° C.], and $N_2O$ flow [50 to 100 standard cubic centimeters per minute (SCCM)], it is possible to achieve the desired fraction. Equation 7 becomes ($P_1 = F_S$):

$y = y(F_S) = C_o F_S - C_1$, [$C_1/C_o \leq F_S \leq (1+C_1)/C_o$] Equation (7A)

where $C_o$ and $C_1$ are calibration constants determined by parameters such as chamber geometry, etc. Typically, with the chamber design described in U.S. Pat. No. 4,371,587, while flowing about 65 SCCM of $N_2O$ at a substrate temperature of about 100° C., $C_o \simeq 0.065/SCCM$, and $C_1 \simeq 0.065$.

Because Equation 7 is monotonic in $F_S$, Equation 9 therefore becomes:

$$P_{1A}(y) = F_S(y) = \frac{y + C_1}{C_o} \quad \text{Equation (9A)}$$

Then Equation 12 for the algorithmic process command for achieving the profile design in Equation 4 becomes:

$$P_{1A}(t;\phi_i) = F_S(t;\phi_i) = \frac{n[z(t);\phi_i] - 1.46}{0.54 \, C_o} + \frac{\text{Equation (12A)}}{C_o}$$

where $n[z(t);\phi_i]$ is from Equation 4 and $$z(t) = \int_0^t R(t')dt' \quad \text{Equation (11A)}$$

where $R(t)$ is the previously calibrated deposition rate or independently measured with a quartz crystal monitor, assuming an average density.

Finally, Equation 8 for the process as a function of time becomes:

$$\Psi_A(t;\phi_i) = \Psi_A[P_{1A}(t;\phi_i)] = \Psi_A[F_S(t;\phi_i)] \quad \text{Equation (8A)}$$

The photochemical vapor deposition process described above was presented merely as an example. Similar calculations may be made for other processes for depositing the optical medium in accordance with the present invention taking into account any specific features of the particular deposition process.

Turning now to FIG. 4a, the process of the present invention is started at box 44. The deposition of the optical medium is allowed to start onto the substrate according to a continuous real time control with initial phase adjustments to the process set to zero (process conditions status initially on schedule with no error). The process conditions are then guided through Equation (4) above in box 46 (film process guide). Inquiry is then made as to whether the current process conditions of deposition of the medium onto the substrate is ahead of the expected optical thickness signal (OT) in box 48. Since the process conditions are initially on schedule at the start 44, flow in the algorithm progresses at least initially to box 52 and then back to 46 since no OT signal will be expected or measured initially. While the process remains (or is assumed to remain) on schedule and no OT is measured ahead of schedule, the algorithm will initially continue in the loop 46-48-52-46.

If the process conditions are ahead of schedule (i.e., a predetermined and expected optical thickness has not been measured yet), then the process parameters are commanded to hold at the expected optical thickness process conditions 50. This "holding" adjustment occurs when in error the currently depositing film index is too low, or the deposition rate is too small, or the current optical thickness of the profile is too small, and therefore the currently commanded process conditions are ahead of schedule relative to the actually measured optical thickness. Subsequent to this adjustment, optical monitoring 52 is conducted. Until the expected optical thickness is actually measured, the algorithm continues in the loop 46-48-50-52-46, which produces commands for continuously changing $\phi_i$ for a constant, horizontal profile command segment. At Diamond 52 optical monitoring is conducted by reflecting a monitor beam of light off the sample or transmitting a monitor beam of light through the sample, typically at a perpendicular angle of incidence or near perpendicular angle of incidence to provide an optical signal, and determining from this optical signal actual optical thicknesses. Typically and conventionally, optical thickness signals are easily provided by intensity minima or maxima in the thusly directed monitor beam of a single wavelength, and these intensity extreme correspond to quarter-waves of optical thickness relative to the monitor beam wavelength. This is referred to in the art as the "turning value" method. When the predetermined optical thickness is finally measured, the algorithm passes the process to box 54 where the phase is fixed at the process conditions for this predetermined optical thickness. In this case the loop 46-48-50-52 is terminated into box 54 where the last values for $\phi_i$ acquired in box 50 are used. After box 54, inquiry is made as to whether the final optical thickness has been reached in box 56. If it has, the process is ended in box 58. If it has not, the film growth process continues with the same phase, at least momentarily, in loop 46-48-52-46 until an affirmative decision in box 48 or 52 is reached.

Passing through box 54 can alternatively occur without first passing through the 46-48-50-52 sequence. This can happen when the process conditions are exactly on schedule with no error and no phase change necessary.

Alternatively, if the process conditions are behind schedule (i.e., a predetermined optical thickness is prematurely measured), then just one set of abrupt phase adjustments is commanded to bring the process conditions to the point of this known optical thickness. This adjustment can occur when, in error, the current deposition rate is too fast or the currently depositing film index is too high, or the current optical thickness of the profile is too large, and therefore the currently commanded process conditions are behind schedule relative to the measured optical thickness. In either of these cases, loop 46-48-52-46 is temporarily interrupted, and there will be one pass through the loop 46-48-52-54-56-46 unless the final optical thickness increment is measured, in which event the process ends through box 56 into box 58.

The object of the algorithm in FIG. 4a is to maintain accurately the product of the actual average index of refraction ($\bar{n}$) and the actual component period thicknesses ($L_i$) so that the Bragg conditions, indicated in Equation (1) above, are maintained component by component, each in their periodically modulated fashions. The process control algorithm of FIG. 4a reads incremental optical thickness signals (graphically shown in FIG. 3a with ($L_1*/4 = \lambda_p/4\bar{n}$ * increments) and governs the manner in which the error corrections of FIG. 3a are accomplished through proper process commands. FIG. 3a schematically shows the optical monitoring signals as measured on a graph of reflectance against film growth thickness (z), using a probe monitoring wavelength at one-half the lowest notch wavelength or $\lambda_p = \frac{1}{2}\lambda_1$. Convenient signals occur at minima and maxima which correspond via the turning-value method to quarter-wave optical thickness increments relative to this probe wavelength or at $\lambda_p/(4\bar{n} *) = L_1*/4$ increments. In FIG. 3a, it may be difficult to clearly see where corrective actions have taken place. Some of the corrections may be too small to see if any correction was necessary at all, or the corrections may be obscured since the depositing profile was still subject to random errors during the corrective command segment.

Horizontal profile segment corrections are made by the algorithm at 102 of FIG. 3a to better meet the desired Bragg condition for each period of film growth. Similarly, FIG. 3a shows where vertical profile jump corrections are made at 104 to meet the desired Bragg conditions. The horizontal profile segments in FIG. 3a correspond with algorithm commands at Box 50 of FIG. 4a where the optical monitoring signal is overdue relative to the current commands of the process conditions, because the current optical thickness rate of deposition is proceeding too slowly, behind schedule. Alternatively, the vertical profile jumps 104 of FIG. 3a show the algorithm commands of Box 54 of FIG. 4a where the current optical thickness rate of deposition is proceeding too fast relative to the current commands of the process conditions, so that optical thickness increments are reached too rapidly, ahead of schedule.

Figure 4B:
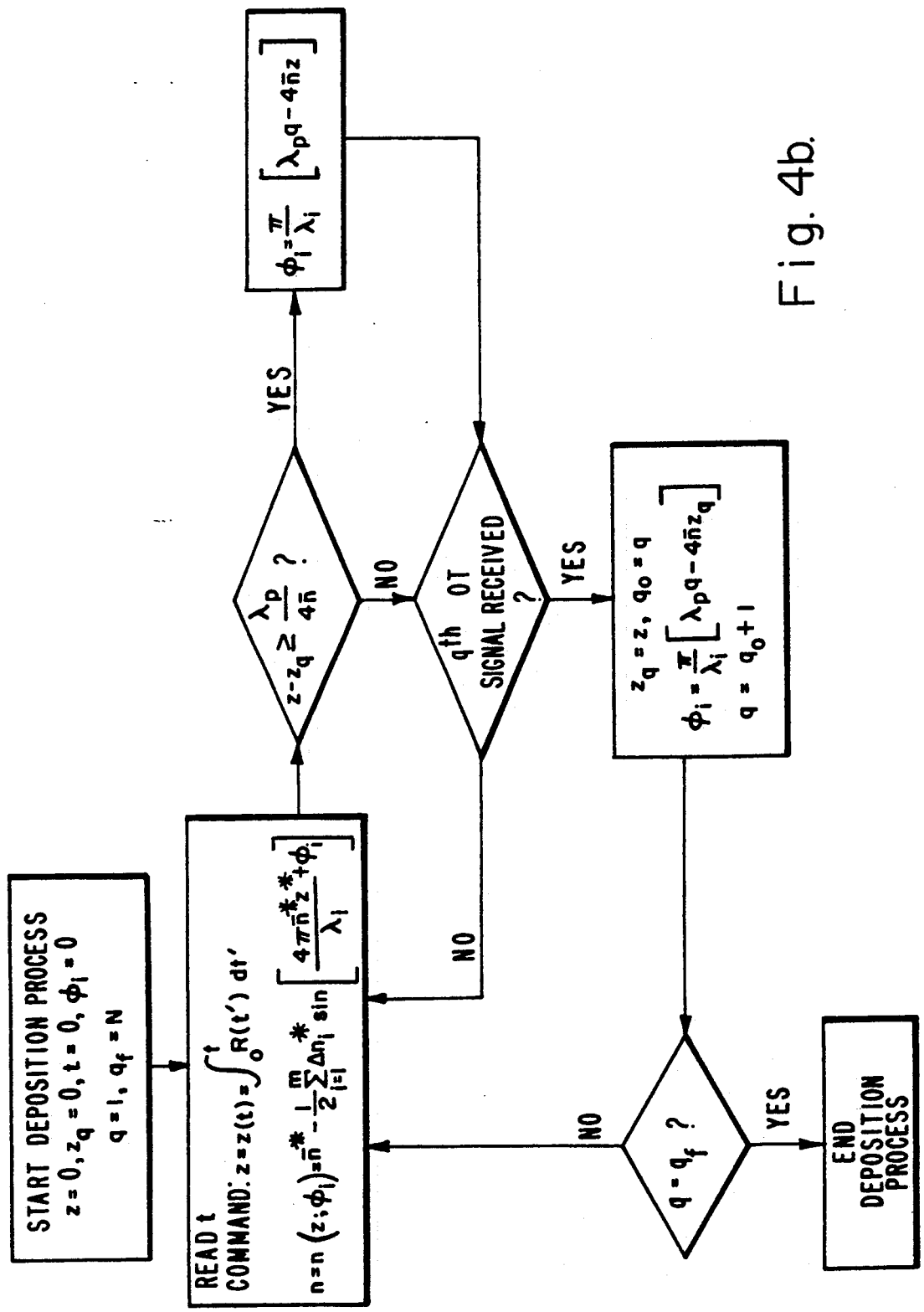
FIG. 4b is a flow diagram of the multiple-sinusoidal phase-control algorithm presenting the control equations of the algorithm commands as a function of time.

FIG. 4b shows the algorithm with pertinent analytic equations (from Equation (4) herein) to guide the process, where N is the final number of optical thickness signals required to reach the desired notch transmittances or reflectances.

More accuracy is of course obtained by monitoring for more corrective opportunities such as can be obtained with lower wavelength beam monitoring. Alternatively, monitoring can be accomplished with scanning monochromator techniques via the figure-of-merit method which results in film thickness increments that correspond to non quarter-wave optical thicknesses shorter than quarter-wave.

The present algorithm method of deposition with error-compensation control can be applied to any process which blindly produces a continuously varying refractive index with sinusoidal components. The algorithm accomplishes this result by providing corrective process commands to insure sufficient maintenance of the Bragg condition for each component throughout the thin film rugate deposition.

Obvious and simple improvements can be incorporated within the framework of the algorithm in FIG. 4a. For example, fixed or nearly fixed systematic errors would result in algorithmic corrections that are nearly identical but continually persistent over many sinusoidal periods of rugate deposition. Obvious process adjustments could be made to minimize such fixed or nearly fixed systematic errors in order to achieve a commanded profile that approaches the ideal target.

Figure 5:
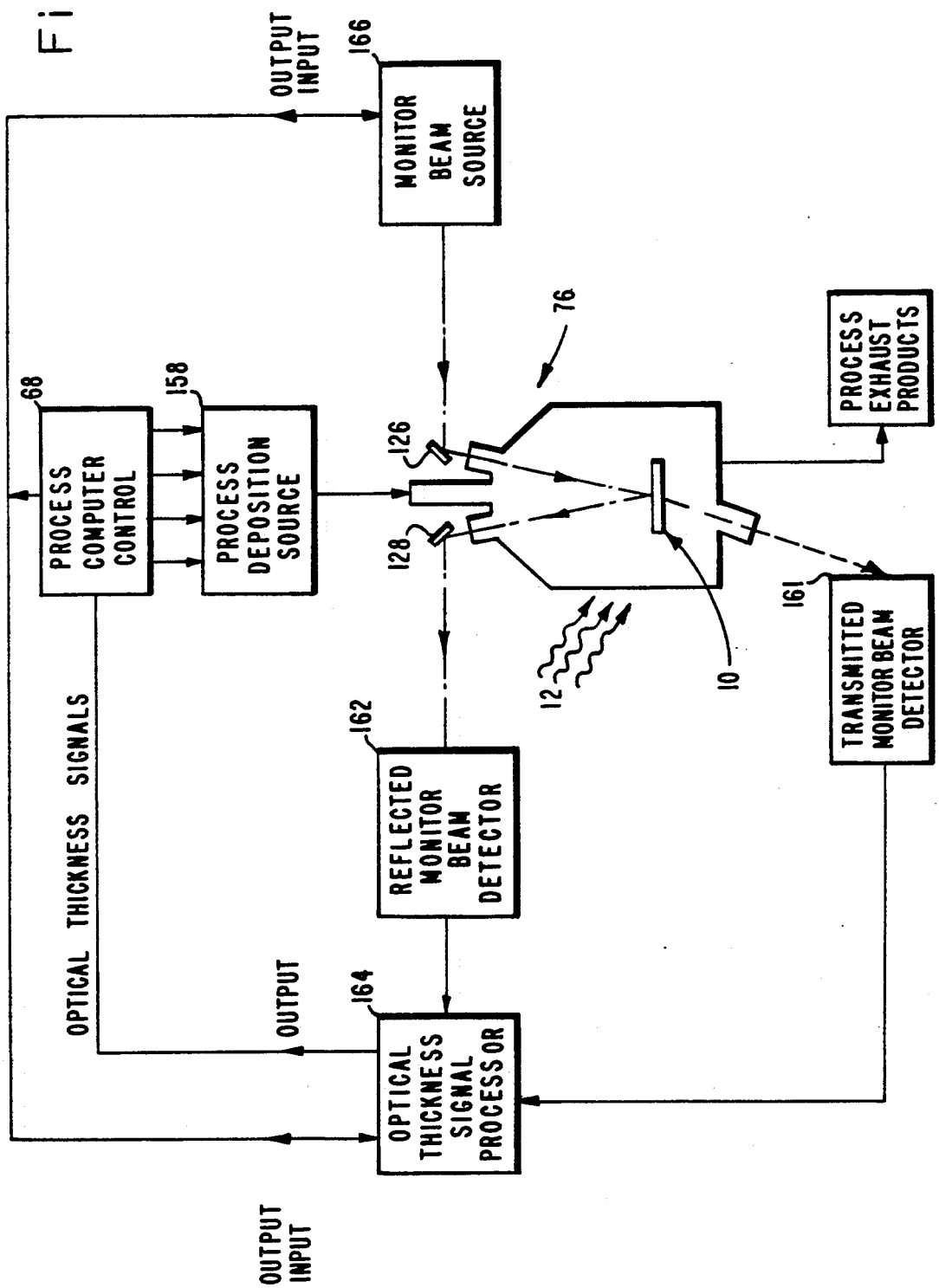
FIG. 5 shows a block diagram of a photochemical vapor deposition process system for producing a multiple-notch rugate filter in accordance with the present invention.

An application of the process control algorithm method of the present invention to preparation of a multiple-notch filter is shown by the photochemical processing block diagram of FIG. 5. The process deposition source 158 comprises, for example, two process gases (silane and nitrous oxide) and one purge gas (nitrogen), which are input through separate mass flow controllers (not shown) to a photochemical vapor deposition system (generally indicated at 76) for growth of a rugate film of a selected material, such as $SiO_x$, to form an optical medium. The gases are supplied from compressed gas cylinders, and the opening and closing of the valves and the flow of the gases through mass flow controllers in the system are controlled automatically by process computer control 68. Optionally, this control may be performed manually. The inflowing silane is used as the silicon source, the nitrous oxide provides a source of oxygen, and both reactants are delivered at flow rates resulting in the predetermined mixture of gases at the deposition substrate or sample 10. The gases and optional minute amounts of mercury vapor, which acts as a photosensitizer, are then inlet into the system to the reactor chamber 76, where the sample substrate 10 is illuminated with radiation 12 which has a wavelength sufficient to induce the desired photochemical reaction. When mercury is used as a photosensitizer, UV radiation of 2537 angstroms from a low-pressure mercury-lamp array is used to induce the reaction to decompose the nitrous oxide and silane compounds and allow the reaction thereof to form a rugate $SiO_x$ film, at about 1/1000 of atmospheric pressure.

Stoichiometry of the film depends on previously calibrated gas flow rates and relative partial pressures of the constituent precursors. The exhaust gases are pulled by a process pump (not shown) and pushed to an exhaust manifold for disposal in a safe manner. The reactor chamber 76 area may be cross-flushed with laminar air flow to maintain cleanliness during substrate loading or removal.

FIG. 5 also represents a generalized optical monitoring scheme useful in practicing the present invention required to obtain optical thickness increments. Alternative to the simple turning value method, more advanced methods including the figure of merit method that involves a wavelength scanning technique, may be used. Light is filtered through an optionally scannable monochromator, either at the monitor beam source 166 or at the detector 162, which sets the monitoring probe wavelength(s), $\lambda_p$. The sample 10 is held within the chamber 76, and light from monitor beam source 166 is reflected from mirror 126 onto the sample 10, and then from the sample 10, onto the mirror 128, for output to the external control system beyond the reactor chamber 76. Alternatively, witness samples receiving partial filter deposition may be moved into place to monitor the deposition process. The reflected monitor beam detector 162 receives the light from the sample 10, and converts the optical input signal from the sample 10 and mirror 128, and electronically processes the optical signal to determine optical thickness increments with the signal processor 164. The optical thickness signal processor provides data to the computer control 68 where the algorithm controls the process. Optionally, transmitted beam detector 161 may be used with the system of FIG. 5. The computer 68 operates in accordance with the process phase control algorithm shown in FIGS. 4a and 4b.

FIG. 5 also generically represents the schematic control of any deposition process that is already capable of blindly producing thin films with a continuously varying refractive index in a sinusoidally modulated fashion but susceptible to random and systematic errors. For example, thermal evaporation, electron beam evaporation, photochemical vapor deposition, sputter deposition, laser-assisted deposition, etc., and combinations of these techniques, can benefit from optical monitoring and algorithm control in accordance with the present invention.

While a particular example or set of examples has been demonstrated for carrying out the process of the present invention, alternative variations of the process, as well as the appearance and final result of the rugate filter of this invention developed using the present process are well within the scope of the foregoing disclosure. Thus alternative embodiments of both the process and product of this invention are intended to be incorporated within the scope of the appended claims.

What is claimed is:

1. A method for forming a multiple-notch rugate filter comprising a substrate having formed thereon a layer of an optical material having a refractive index that varies according to a continuous predetermined pattern as a function of the thickness of said layer, comprising the steps of:

(a) providing said substrate;
  (b) providing rectants which interact physically or chemically to form said optical material as a layer on said substrate;
  (c) providing an ideal target profile of refractive index versus thickness of said layer, said profile having a multiple-notch composite pattern formed from superpositioned single-notch patterns, and determining from said target profile ideal values of optical thickness at successive points in time corresponding to points along said profile;
  (d) providing target process conditions as a function of time for said reactants operative to form said layer having said ideal target profile;
  (e) initiating said process conditions to form a layer having a depositing profile;
  (f) performing continuous optical monitoring of said layer as deposited to provide an optical signal;
  (g) determining from said optical signal the measured increments of optical thickness of said layer as deposited and continuously monitoring said increments of optical thickness;
  (h) determining whether said optical thickness value is measured at the predetermined time relative to said target process conditions that produce said ideal target profile;
  (i) based on the results of (h), determining the multiple sinusoidal phase-angle adjustments required to be made to the depositing profile of refractive index versus thickness of said layer in order to follow accurately said ideal target profile, wherein said determining comprises applying the following equation:

$$n(z; \phi_i) = \overline{n}^* - \tfrac{1}{2} \sum_{i=1}^{m} \Delta n_i^* \sin\left( \frac{4\pi \overline{n}^* z^*}{\lambda_i} + \phi_i \right)$$

where n = refractive index of optical material
  $\overline{n}$ = average index of refraction over one period in film thickness space (z)
  m = total number of rugate transmittance notches
  z = design position of layer
  i = component integer
  $\Delta n_i$ = $i^{th}$ peak-to-trough index modulation
  $\lambda_i$ = $i^{th}$ notch wavelength
  $\phi_i$ = $i^{th}$ sinusoidal phase angle adjustment, continually updated by algorithm to insure Bragg reflection at $\lambda_i$
  * = parameters that can have local errors, which are compensated for by $\phi_i$ (j) altering said process conditions over time to provide said adjustments to said actual profile;
  (k) repeating steps "f" through "j" the number of times required to form said multiple-notch rugate filter.

2. The method of claim 1 wherein:
  (a) said optical thickness value in step "h" is measured after said predetermined time; and
  (b) said adjustments in step "i" command a continuous horizontal segment adjustment to said depositing profile.

3. The method of claim 1 wherein:
  (a) said optical thickness value in step "h" is measured before said predetermined time; and
  (b) said adjustments in step "i" command a vertical segment adjustment to said depositing profile.

4. The method of claim 1 wherein:
  (a) said optical thickness value in step "h" is measured at said predetermined time; and
  (b) said adjustments are zero.

5. The method of claim 1 wherein steps "c" through "k" are under computer control.

6. The method of claim 1 wherein said optical monitoring of step "f" comprises directing an optical monitoring light beam at said layer as deposited so that said light beam is reflected off or transmitted through said layer at normal or near normal incidence into an optical detector means, wherein said detector means generates said optical signal which is a function of said light beam directed into said detector.

7. The method of claim 1 wherein said reactants interact chemically upon radiation inducement.

8. The method of claim 7 wherein said reactants comprise silane and nitrous oxide.

9. A multiple-notch rugate filter formed by the method of claim 1 wherein said filter produces reflections at multiple bands of wavelength and said reflection at each of said bands of wavelength follows Bragg's law.

* * * * *